(12) United States Patent
Terashima (10) Patent No.: US 7,071,516 B2
(45) Date of Patent: Jul. 4, 2006

(54) SEMICONDUCTOR DEVICE AND DRIVING CIRCUIT FOR SEMICONDUCTOR DEVICE

(75) Inventor: Tomohide Terashima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 52 days.

(21) Appl. No.: 10/866,677

(22) Filed: Jun. 15, 2004

(65) Prior Publication Data
US 2005/0072990 A1  Apr. 7, 2005

(30) Foreign Application Priority Data
Oct. 2, 2003 (JP) ............................. 2003-344314

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/378; 257/370; 257/526; 257/539; 257/552; 257/566; 257/565; 257/572

(58) Field of Classification Search ............... 257/370, 257/378, 526, 539, 552, 566–565, 572
See application file for complete search history.

(56) References Cited

U.S. PATENT DOCUMENTS

| | | | | |
|---|---|---|---|---|
| 5,144,400 A | * | 9/1992 | Bauer | 257/138 |
| 5,276,339 A | * | 1/1994 | Fujishima | 257/127 |
| 5,319,221 A | * | 6/1994 | Ueno | 257/135 |
| 5,321,281 A | * | 6/1994 | Yamaguchi et al. | 257/212 |
| 5,345,095 A | * | 9/1994 | Niwayama | 257/138 |
| 5,378,903 A | * | 1/1995 | Otsuki et al. | 257/133 |
| 5,396,087 A | * | 3/1995 | Baliga | 257/139 |
| 5,459,339 A | * | 10/1995 | Sakurai et al. | 257/167 |
| 5,705,835 A | * | 1/1998 | Nishiura et al. | 257/147 |
| 5,744,830 A | * | 4/1998 | Ekkanath-Madathil et al. | 257/140 |
| 5,903,034 A | * | 5/1999 | Sakamoto et al. | 257/379 |
| 5,923,055 A | * | 7/1999 | Schlangenotto et al. | 257/147 |
| 6,140,679 A | * | 10/2000 | Ferla et al. | 257/341 |
| 6,198,130 B1 | * | 3/2001 | Nobuto et al. | 257/343 |
| 6,211,549 B1 | * | 4/2001 | Funaki et al. | 257/329 |
| 6,469,352 B1 | * | 10/2002 | Ohshima et al. | 257/355 |
| 2004/0124489 A1 | * | 7/2004 | Tsukanov et al. | 257/500 |

OTHER PUBLICATIONS

H.P. Yee, et al, "The Fast Turn Off Advanced IGBT, a New Device Concept", Proc. of the Internat. Symposium on Power Semiconductor Devices & IC's, IEEE Cat. No. 94CH3377-9, Session 3, Poster Session 11GBT, Paper 3.4, May 31-Jun. 2, 1994, pp. 63-67.

* cited by examiner

*Primary Examiner*—Ida M. Soward
(74) *Attorney, Agent, or Firm*—Oblon, Spivak, McClelland, Maier & Neustadt, P.C.

(57) ABSTRACT

A PMOS transistor (Q2) provided for developing a short circuit between the base and emitter of an N-type IGBT during turn-OFF includes a P diffusion region (5), a P diffusion region (6), and a conductive film (10) and a second gate electrode (15) provided via a gate oxide film (21) on a surface of an N⁻ epitaxial layer (2) between the P diffusion regions (5 and 6). The gate oxide film (21) is formed in a thickness having a gate breakdown voltage higher than the element breakdown voltage of a typical field oxide film and the like.

10 Claims, 9 Drawing Sheets

SEMICONDUCTOR DEVICE AND DRIVING CIRCUIT FOR SEMICONDUCTOR DEVICE

BACKGROUND OF THE INVENTION

1. Field of the Invention

This invention relates to semiconductor devices including an insulated gate bipolar transistor (IGBT) and driving circuits for the semiconductor devices.

2. Description of the Background Art

An exemplary semiconductor device with an additional control PMOS transistor for developing a short circuit during turn-OFF between the base and emitter of a PNP bipolar transistor included in an N-type IGBT is disclosed in "The Fast Turn Off Advanced IGBT, a New Device Concept", the 6th International Symposium on Power Semiconductor Devices & IC's, 1994, by H. P. Yee, P. O. Lauritzen and Robert B. Darling (pp.63–67).

However, it has been difficult even in such structure with the additional control PMOS transistor to drive its IGBT while maintaining low effective ON resistance and low switching loss.

SUMMARY OF THE INVENTION

It is an object of this invention to obtain a semiconductor device including an IGBT having an element structure such that it is controlled easily and reliably, and a driving circuit for the semiconductor device which drives the semiconductor device while maintaining low effective ON resistance and low switching loss.

According to this invention, a semiconductor device includes an insulated gate bipolar transistor (IGBT) and a second insulated gate transistor. The IGBT includes a first insulated gate transistor of a first conductivity type and a bipolar transistor of a second conductivity type connected between first and second main electrodes. The second insulated gate transistor is added for developing a short circuit between the base and emitter of the bipolar transistor during turn-OFF of the IGBT. The thickness of the second insulated gate transistor is so set as to satisfy a prescribed breakdown voltage higher than the element breakdown voltage of the IGBT.

The operation of the second insulated gate transistor can be controlled by a voltage similar to that to be supplied to the first and second main electrodes of the IGBT. Therefore, the driving circuit for the semiconductor device of this invention can be realized by a relatively simple structure.

These and other objects, features, aspects and advantages of the present invention will become more apparent from the following detailed description of the present invention when taken in conjunction with the accompanying drawings.

DESCRIPTION OF THE PREFERRED EMBODIMENTS

<Introduction>

Figure 12:
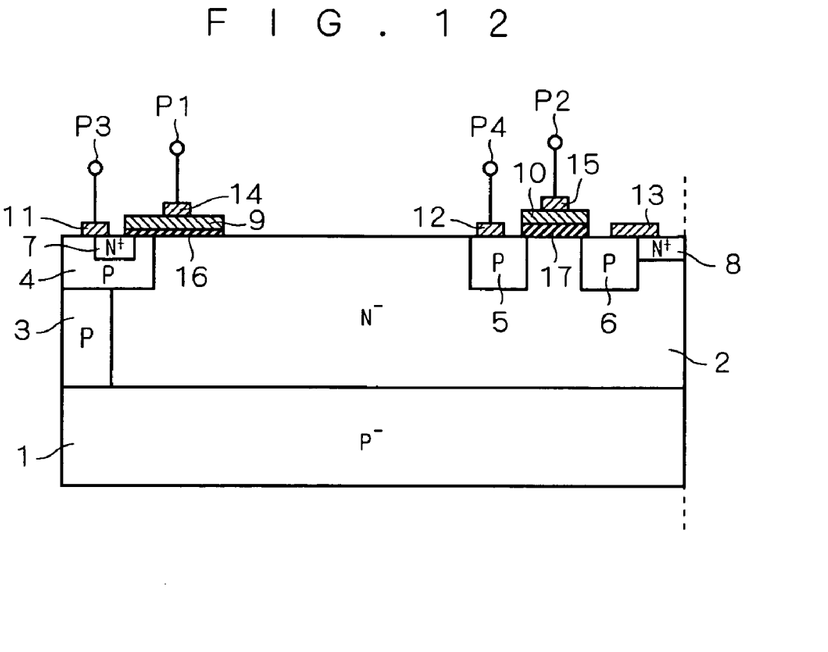
FIG. 12 is a cross-sectional view showing a typical structure of a semiconductor device having an IGBT with an additional control PMOS transistor.

FIG. 12 is a cross-sectional view showing a typical structure of a semiconductor device including an IGBT (NMOS transistor+PNP bipolar transistor) of N-type (first conductivity type) with an additional control MOS transistor of P-type (second conductivity type).

As shown in FIG. 12, an N⁻ epitaxial layer 2 (base layer) is formed on a P⁻ substrate 1. A P diffusion region 3 is formed selectively in the lower part of the N⁻ epitaxial layer 2, and a P diffusion region 4 which is an electrode diffusion region is formed in the upper part of the N⁻ epitaxial layer 2. The P diffusion region 4 is formed partially adjacently to the P diffusion region 3 in the depth direction. An N⁺ diffusion region 7 which is an electrode diffusion region is formed selectively in a surface of the P diffusion region 4.

P diffusion regions 5 and 6 which are both electrode diffusion regions are respectively formed selectively in the upper part of the N⁻ epitaxial layer 2, independently of the P diffusion region 4. A conductive film 10 is formed via a gate oxide film 17 on the N⁻ epitaxial layer 2 between the P diffusion regions 5 and 6, and a second gate electrode 15 is provided on the conductive film 10. A collector electrode 12 (first main electrode) is provided on the P diffusion region 5.

Further, an N⁺ diffusion region 8 which is an auxiliary diffusion region is formed adjacently to the P diffusion region 6 in the upper part of the N⁻ epitaxial layer 2, and a floating electrode 13 is formed across part of a surface of the P diffusion region 6 and part of a surface of the N⁺ diffusion region 8.

A gate oxide film 16 is formed across part of a surface of the N+ diffusion region 7, part of a surface of the P diffusion region 4, and part of the surface of the N⁻ epitaxial layer 2. A conductive film 9 is formed on the gate oxide film 16, and a first gate electrode 14 is formed on the conductive film 9. An emitter electrode 11 (second main electrode) is formed across part of the surface of the P diffusion region 4 and part of the surface of the N+ diffusion region 7, independently of the conductive film 9.

A first gate terminal P1 is electrically connected to the first gate electrode 14, a second gate terminal P2 is electrically connected to the second gate electrode 15, an emitter terminal P3 is electrically connected to the emitter electrode 11, and a collector terminal P4 is electrically connected to the collector electrode 12.

In plan view, the P diffusion region 3 is so formed as to surround the N⁻ epitaxial layer 2, typically exhibiting a concentric ring structure with the right end portion of the N⁻ epitaxial layer 2 shown in FIG. 12 as the center.

Figure 13:
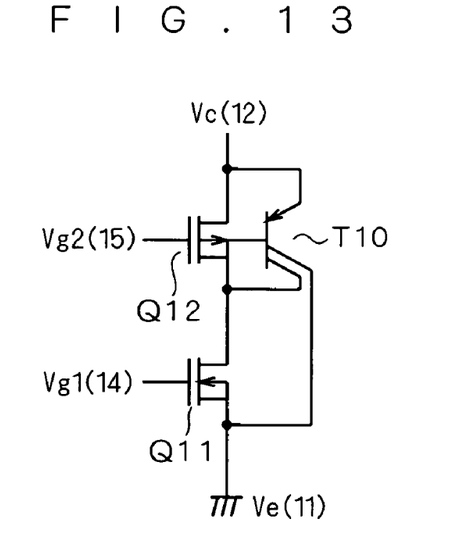
FIG. 13 is a circuit diagram showing an equivalent circuit of the semiconductor device shown in FIG. 12.

FIG. 13 is a circuit diagram showing an equivalent circuit of the semiconductor device shown in FIG. 12. As shown in FIG. 13, the semiconductor device includes a PNP bipolar transistor T10, an NMOS transistor Q11, and a PMOS transistor Q12.

The PNP bipolar transistor T10 principally includes the P diffusion region 5 (emitter region), the N⁻ epitaxial layer 2 (base layer), and the P diffusion region 4 (first collector region), and in an auxiliary manner includes the P diffusion region 5 (emitter region), the N⁻ epitaxial layer 2 (base layer), and the P diffusion region 6 (second collector region). The collector electrode 12 of the IGBT is provided on the P diffusion region 5 of the PNP bipolar transistor T11, while the emitter electrode 11 of the IGBT is provided on the P diffusion region 4 of the PNP bipolar transistor T10.

The NMOS transistor Q11 basically includes the N+ diffusion region 7, the N⁻ epitaxial layer 2 (source/drain regions) and the first gate electrode 14. The PMOS transistor Q12 basically includes the P diffusion regions 5, 6 (source/drain regions) and the second gate electrode 15.

The PMOS transistor Q12 is inserted between the emitter and second collector of the PNP bipolar transistor T10, while the NMOS transistor Q11 is inserted between the second collector and first collector of the PNP bipolar transistor T11.

In FIG. 13, a first gate voltage Vg1 is applied to the first gate terminal P1 (see FIG. 12), a second gate voltage Vg2 is applied to the second gate terminal P2 (see FIG. 12), an emitter voltage Ve is applied to the emitter terminal P3 (see FIG. 12), and a collector voltage Vc is applied to the collector terminal P4 (see FIG. 12).

In the OFF state, the semiconductor device having such structure maintains the breakdown voltage by setting the first gate voltage Vg1 at 0V to turn the NMOS transistor Q11 off. At this time, a depletion layer extends from the P⁻ substrate 1 toward the N⁻ epitaxial layer 2 to reach the surface of the N⁻ epitaxial layer 2, thereby achieving high breakdown voltage. This phenomenon is generally called a RESURF (REduced SURFace) effect. Alternatively, high breakdown voltage can be achieved by forming an N well surrounding the P diffusion regions 5 and 6 so as to prevent punch-through to the P diffusion regions 5 and 6, or by forming an additional N+ diffusion region on the left of the P diffusion region 5 in the surface of the N⁻ epitaxial layer 2 in FIG. 12.

In the ON state, on the other hand, the first gate voltage Vg1 is biased to a positive prescribed voltage to supply a base current of the PNP bipolar transistor T10, thereby activating the PNP bipolar transistor T10 to drive the IGBT.

The PNP bipolar transistor T10 exhibits a multi-collector structure having the first and second collectors, in which the component flowing to the PMOS transistor Q12 does not contribute to the IGBT operation because it flows to the NMOS transistor Q11 eventually via the N+ diffusion region 8. Thus the current component flowing to the PMOS transistor Q12 is kept low.

It is essential for the PMOS transistor Q12 to be in the OFF state during the IGBT operation. If the PMOS transistor Q12 enters the ON state during the IGBT operation, a short circuit is developed between the emitter and collector of the PNP bipolar transistor T10, whereby the PNP bipolar transistor T10 stops the operation, and the NMOS transistors Q11 and the PMOS transistor Q12 get electrically connected in series. This results in an extreme increase in ON resistance.

Most of the N⁻ epitaxial layer 2 is subjected to conductivity modulation while the IGBT is in the ON state. Accordingly, when the first gate voltage Vg1 is returned to 0V during the ON state, the ON state is maintained for some time afterwards while residual carriers are discharged. Then the depletion layer extends as mentioned above, turning to the OFF state.

Figure 14:
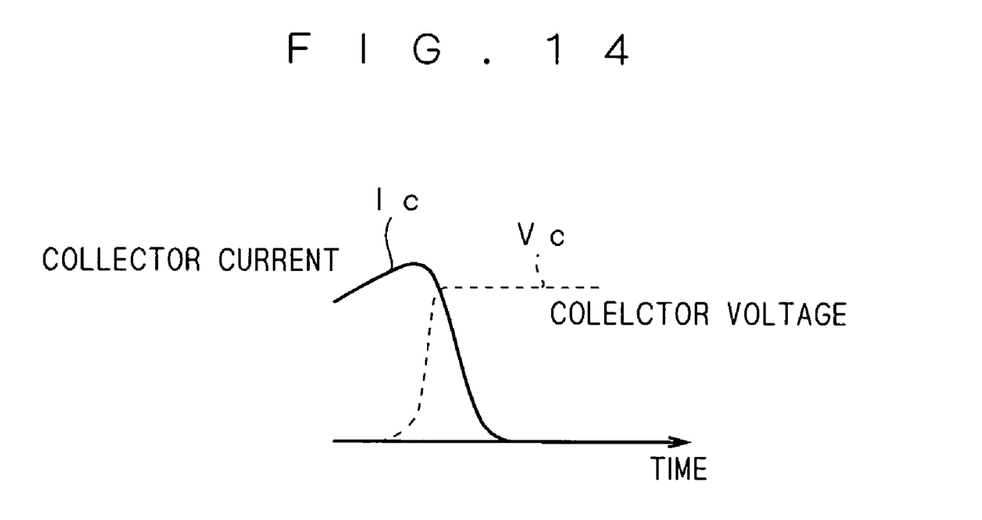
FIG. 14 illustrates a turn-OFF operation of the IGBT shown in FIGS. 12 and 13.

FIG. 14 illustrates a waveform of collector current (Ic) and collector voltage (Vc) during a turn-OFF operation of the IGBT shown in FIGS. 12 and 13.

As shown in FIG. 14, when the PMOS transistor Q12 is in the OFF state during turn-OFF, a PN junction between the P diffusion region 5 and the N⁻ epitaxial layer 2 is always forward-biased in response to the current flowing to the PNP bipolar transistor T10. This requires time for the collector current IC to become "0", resulting in switching loss.

Figure 15:
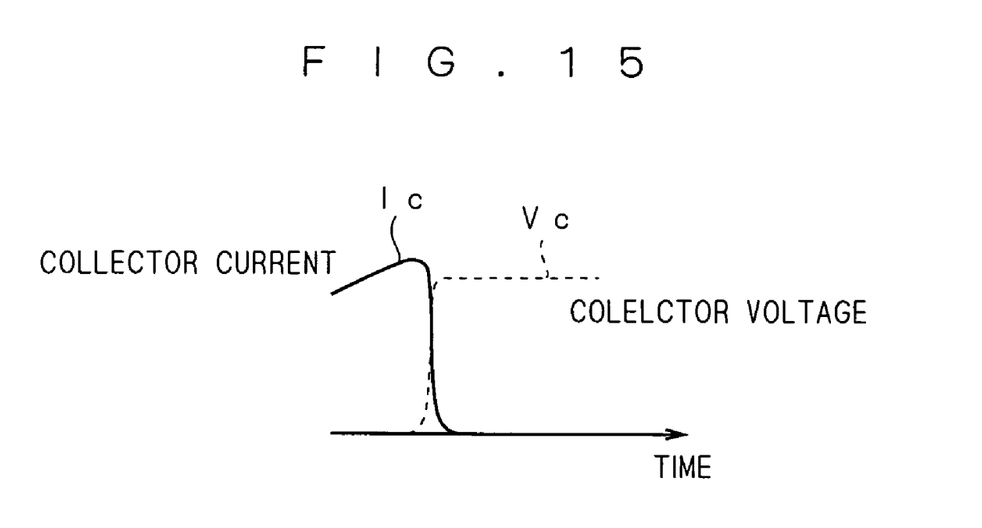
FIG. 15 illustrates an ideal turn-OFF operation of an IGBT.

FIG. 15 illustrates an ideal waveform of the collector current (Ic) and collector voltage (Vc) during the turn-OFF operation of the IGBT.

When the PMOS transistor Q12 is in the ON state during turn-OFF, the residual carriers are discharged via the PMOS transistor Q12, whereby the above phenomenon in which the PN junction is forward-biased is prevented. Consequently, the collector voltage Vc rises at the same time the residual carriers are discharged as shown in FIG. 15, keeping switching loss low.

As described above, in the semiconductor device including the IGBT (PNP bipolar transistor T10+NMOS transistor Q11) with the additional PMOS transistor Q12, driving the gate (ON/OFF control) of the PMOS transistor Q12 is of extreme importance. However, driving the gate of the PMOS transistor Q12 is performed only with difficulty.

This is because the gate of the PMOS transistor Q12, which usually operates by a gate voltage with reference to the collector electrode 12, needs to be driven relatively to the collector voltage Vc.

Figure 16:
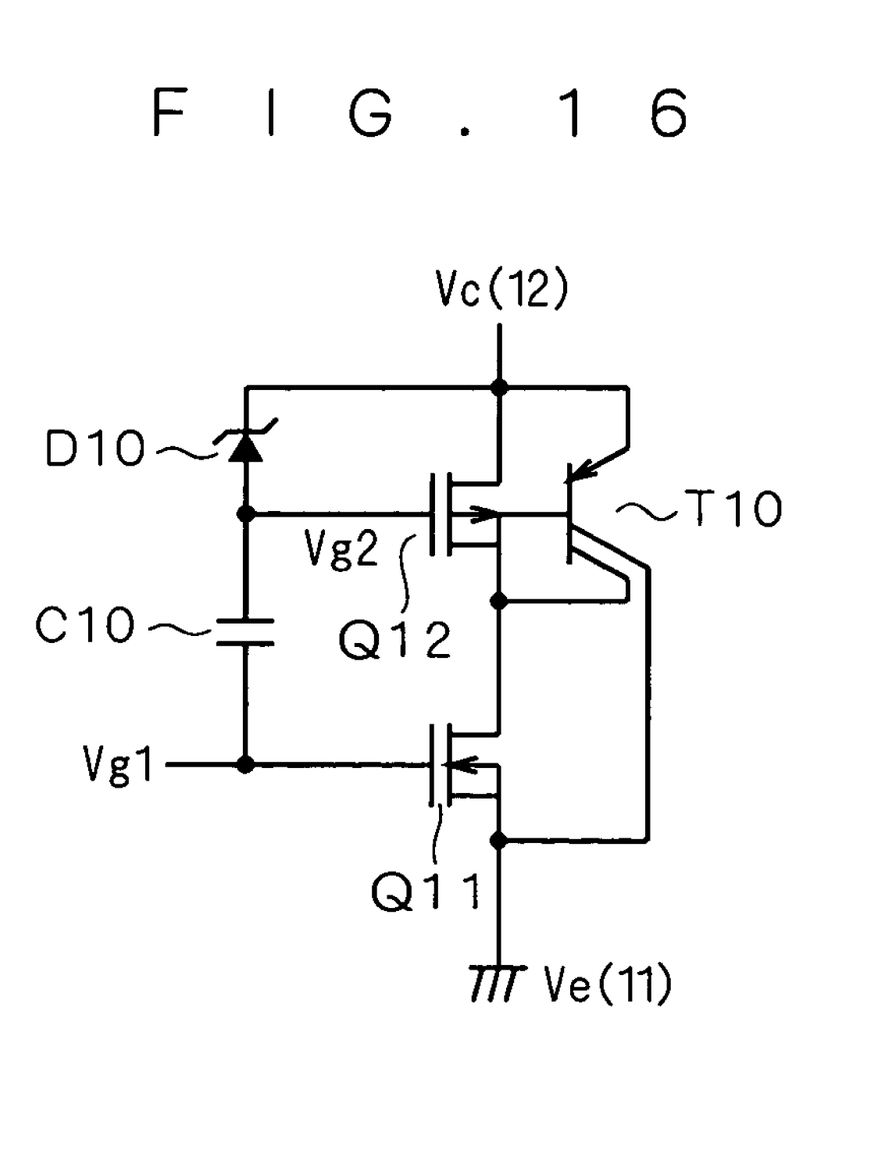
FIG. 16 is a circuit diagram showing an example of driving first and second gate voltages.

FIG. 16 is a circuit diagram showing an example of driving the first gate voltage Vg1 and the second gate voltage Vg2. As shown in FIG. 16, a diode D10 (having the anode on the gate electrode side of the PMOS transistor Q12) is inserted between the collector electrode 12 and the gate electrode of the PMOS transistor Q12, and a capacitor C10 is inserted between the respective gate electrodes of the NMOS transistors Q11 and the PMOS transistor Q12.

In such structure where the first gate voltage Vg1 is capacitively coupled to the collector electrode 12, a current inevitably flows to the driving circuit of the first gate voltage Vg1 due to dV/dt of the collector voltage Vc. This leaves the driving circuit of the first gate voltage Vg1 open to malfunctions.

First Preferred Embodiment

Figure 1:
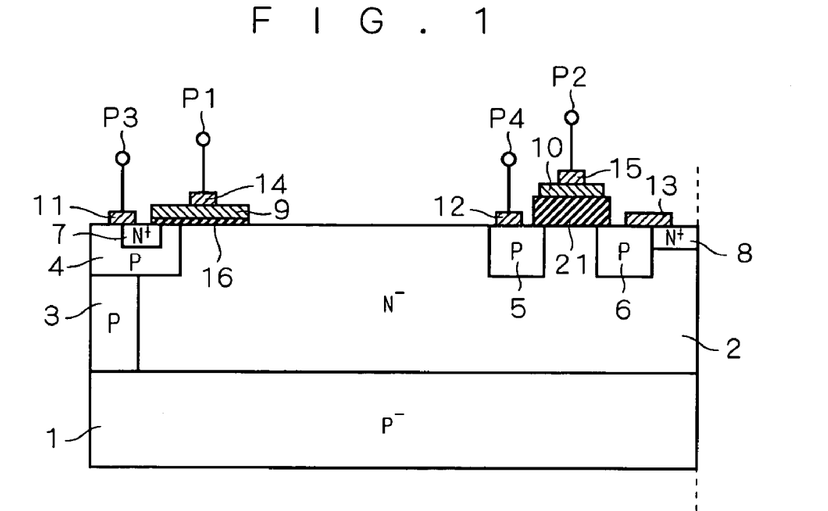
FIG. 1 is a cross-sectional view showing a semiconductor device structure having an IGBT according to a first preferred embodiment of this invention.

FIG. 1 is a cross-sectional view showing a semiconductor device structure having an IGBT according to a first preferred embodiment of this invention. As shown in FIG. 1, a PMOS transistor Q2 includes P diffusion regions 5 and 6, and a conductive film 10 and a second gate electrode 15 formed via a gate oxide film 21 on a surface of an N⁻ epitaxial layer 2 between the P diffusion regions 5 and 6.

The gate oxide film 21 is formed in a thickness having a gate breakdown voltage higher than the element breakdown voltage of the IGBT, like a typical field oxide film and the like. Namely, the thickness of the gate oxide film 21 is so set as to satisfy a prescribed breakdown voltage higher than the element breakdown voltage of the IGBT. Accordingly, the PMOS transistor Q2 works without a hitch when the gate electrode thereof is driven with a potential difference of the same level as that generated between an emitter electrode 11 and a collector electrode 12 during the IGBT operation. The other constituent elements are similar to those in the background art shown in FIG. 12.

Figure 2:
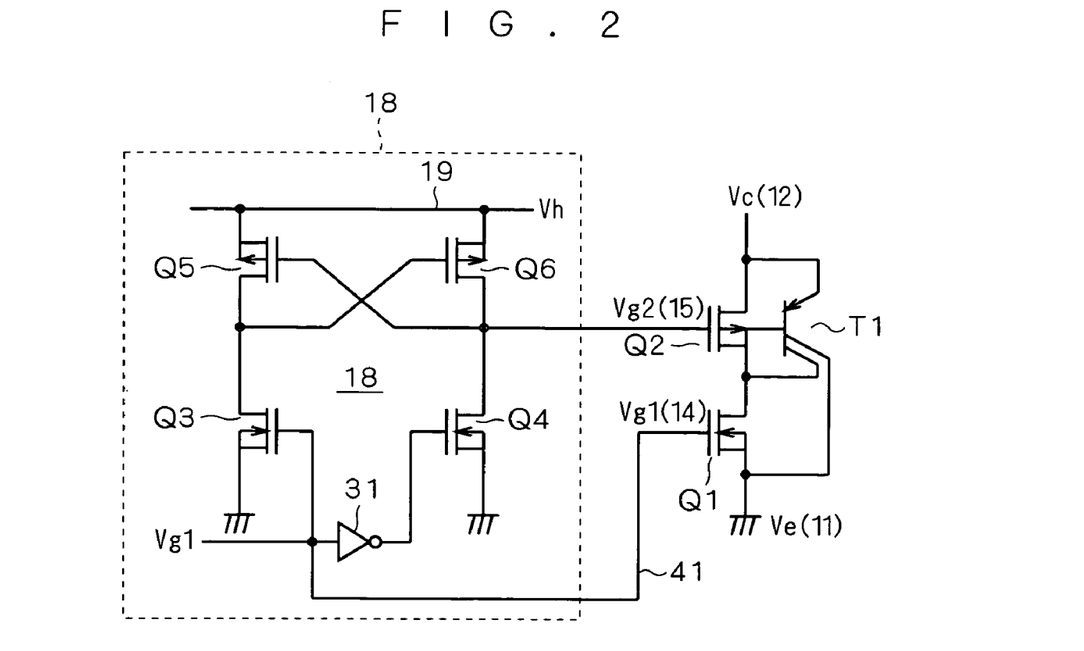
FIG. 2 is a circuit diagram showing a driving circuit for the semiconductor device shown in FIG. 1.

FIG. 2 is a circuit diagram showing a driving circuit for the semiconductor device shown in FIG. 1. As shown in FIG. 2, the semiconductor device according to the first preferred embodiment includes a PNP bipolar transistor T1, an NMOS transistor Q1, and the PMOS transistor Q2.

Like the PNP bipolar transistor T10 described in the background art section (FIGS. 12 and 13), the PNP bipolar transistor T1 principally includes the P diffusion region 5 (emitter region), the N⁻ epitaxial layer 2 (base layer), and a P diffusion region 4 (first collector region), and in an auxiliary manner includes the P diffusion region 5 (emitter region), the N⁻ epitaxial layer 2 (base layer), and the P diffusion region 6 (second collector region).

Like the NMOS transistor Q11 described in the background art section (FIGS. 12 and 13), the NMOS transistor Q1 basically includes an N⁺ diffusion region 7, the N⁻ epitaxial layer 2 (source/drain regions), a first gate electrode 14, a gate oxide film 16, and the P diffusion region 4.

As shown in FIG. 2, the PMOS transistor Q2 is inserted between the emitter and second collector of the PNP bipolar transistor T1, while the NMOS transistor Q1 is inserted between the second collector and first collector of the PNP bipolar transistor T1.

In FIG. 2, a first gate voltage Vg1 is applied to a first gate terminal P1 (see FIG. 1), a second gate voltage Vg2 is applied to a second gate terminal P2 (see FIG. 1), an emitter voltage Ve is applied to an emitter terminal P3 (see FIG. 1), and a collector voltage Vc is applied to a collector terminal P4 (see FIG. 1).

An inverter driving circuit 18 for driving the semiconductor device according to the first preferred embodiment supplies the first gate voltage Vg1 to the gate electrode of the NMOS transistor Q1 via a signal line 41 (first control signal supply means).

The inverter driving circuit 18 also includes second control signal supply means having NMOS transistors Q3 and Q4, PMOS transistors Q5 and Q6, a power supply line 19, and an inverter 31. The PMOS transistor Q5 and the NMOS transistor Q3, and the PMOS transistor Q6 and the NMOS transistor Q4 are respectively inserted in series between the power supply line 19 and a ground level.

The gate of the NMOS transistor Q3 receives the first gate voltage Vg1, and the gate of the NMOS transistor Q4 receives an inversion signal of the first gate voltage Vg1 obtained via the inverter 31. The gate of the PMOS transistor Q5 is connected to the drain of the PMOS transistor Q6, and the gate of the PMOS transistor Q6 is connected to the drain of the PMOS transistor Q5. The drain of the PMOS transistor Q6 (drain of the NMOS transistor Q4) is connected to the gate electrode of the PMOS transistor Q2.

The power supply line 19 is supplied with a constant voltage Vh that is similar to or higher than the collector voltage Vc. When the constant voltage Vh is set to be similar to the collector voltage Vc, the collector voltage Vc can be supplied to the power supply line 19.

Each of the NMOS transistors Q3 and Q4 is made of an NMOS transistor having an element breakdown voltage similar to those of the NMOS transistor Q1 and the PMOS transistors Q5 and Q6 of an extremely high gate oxide film breakdown voltage.

In such structure, during the IGBT's ON state (when the first gate voltage Vg1 which is a positive prescribed voltage is applied via the signal line 41), the second control signal supply means in the inverter driving circuit 18 sets the second gate voltage Vg2 at the constant voltage Vh (first voltage for turning the PMOS transistor Q2 off) in response to the first gate voltage Vg1, thereby turning the PMOS transistor Q2 off reliably. At this time, the gate oxide film 21 of the PMOS transistor Q2 is not broken even when driven by a relatively high constant voltage Vh because the breakdown voltage is enhanced by making the gate oxide film 21 sufficiently thick, as mentioned above.

On the other hand, during turn-OFF of the IGBT (when the first gate voltage Vg1 obtained via the signal line 41 changes from the positive prescribed voltage to 0V), the second control signal supply means in the inverter driving circuit 18 is capable of setting the second gate voltage Vg2 at the ground level (second voltage for turning the PMOS transistor Q2 on), thereby turning the PMOS transistor Q2 on reliably.

In this fashion, the inverter driving circuit 18 according to the first preferred embodiment, which generates the second gate voltage Vg2 in response to the first gate voltage Vg1, is capable of driving the PMOS transistor Q2 to the OFF state during the IGBT's ON state and driving the PMOS transistor Q2 to the ON state during the IGBT's OFF state. Therefore, the semiconductor device according to the first preferred embodiment can be driven while maintaining low effective ON resistance and low switching loss.

Second Preferred Embodiment

Figure 3:
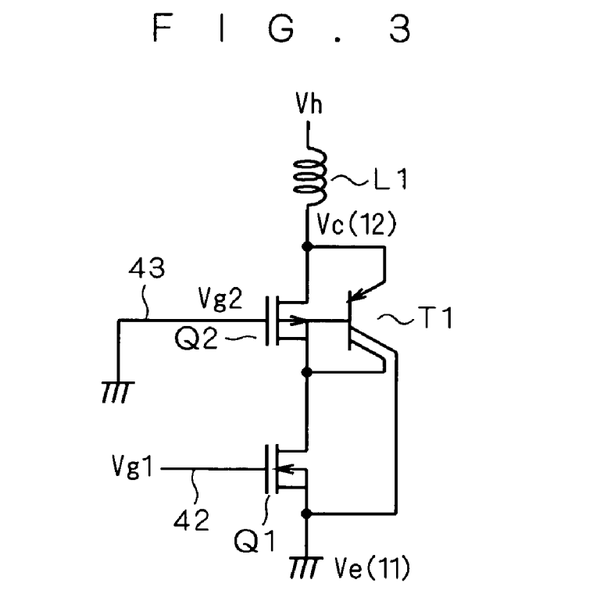
FIG. 3 is a circuit diagram showing a driving circuit for a semiconductor device according to a second preferred embodiment of this invention.

FIG. 3 is a circuit diagram showing a driving circuit for a semiconductor device according to a second preferred embodiment of this invention. As shown in FIG. 3, a coil L1 is added to the semiconductor device (PNP bipolar transistor T1, NMOS transistor Q1 and PMOS transistor Q2) according to the first preferred embodiment.

The first gate voltage Vg1 is applied to the gate of the NMOS transistor Q1 via a signal line 42 which is control signal supply means, and the ground level is applied as the second gate voltage Vg2 to the gate of the PMOS transistor Q2 via a signal line 43 which is fixed potential supply means. The coil L1 has one end applied with the constant voltage Vh and the other end connected to the emitter of the PNP bipolar transistor T1 and the source of the PMOS transistor Q2. The coil L1 has the inductance of 100 mH, for example.

In FIG. 3, the first gate voltage Vg1 is applied to the first gate terminal P1 (see FIG. 1), the second gate voltage Vg2 (ground level) is applied to the second gate terminal P2 (see FIG. 1), the emitter voltage Ve is applied to the emitter terminal P3 (see FIG. 1), and the collector voltage Vc is applied to the collector terminal P4 (see FIG. 1).

In such structure, during the IGBT's OFF state (when the first gate voltage Vg1 is 0V), the collector voltage Vc becomes the same potential as the constant voltage Vh (>Vth (threshold voltage of the PMOS transistor Q2)), thereby turning on the PMOS transistor Q2 the gate potential of which is grounded and fixed reliably. This is because the ground level is a potential of the constant voltage Vh shifted by more than the threshold voltage Vth in the direction of turning the PMOS transistor Q2 on.

During turn-ON of the IGBT (when the first gate voltage Vg1 changes from 0V to the positive prescribed voltage), a current flows to the PMOS transistor Q2 in the ON state, whereby most of the constant voltage Vh is consumed by the Ldi/dt component of the coil L1, and the collector voltage Vc quickly drops close to the ground potential. Then, the PMOS transistor Q2 enters the OFF state at the same time the collector voltage Vc falls below the threshold voltage Vth of the PMOS transistor Q2, and the IGBT starts the operation.

During turn-OFF of the IGBT (when the first gate voltage Vg1 changes from the positive prescribed voltage to 0V), on the other hand, the ON state is maintained until after residual carriers in most of the N⁻ epitaxial layer 2 are discharged. Then, the number of the residual carriers decreases and the collector voltage Vc rises again to become higher than the threshold voltage Vth before the PMOS transistor Q2 enters the ON state and interrupts hole supply. Subsequently, because holes are no longer supplied when the residual carriers become almost non-existent and the collector voltage Vc rises quickly, the IGBT shifts to the OFF state extremely quickly.

In this fashion, the driving circuit according to the second preferred embodiment that is provided with the coil L1 on the emitter side of the PNP bipolar transistor T1 and supplies the fixed voltage (ground level) as the second gate voltage Vg2 can also drive the semiconductor device according to the first preferred embodiment while maintaining low effective ON resistance and low switching loss, like the inverter driving circuit 18 in the first preferred embodiment.

<Third Preferred Embodiment>

Because turn-ON/OFF of the PMOS transistor Q2 is basically determined by a potential difference between the threshold voltage Vth of the PMOS transistor Q2 and the collector voltage Vc, it is conceivable that the threshold voltage Vth of the PMOS transistor Q2 should be optimized, or instead of optimization of the threshold voltage Vth, the second gate voltage Vg2 should be made variable voltage to be adjusted during turn-ON/OFF of the IGBT rather than fixed voltage as in the second preferred embodiment. A third preferred embodiment realizes a relatively simple circuit structure by making the second gate voltage Vg2 variable voltage.

Figure 4:
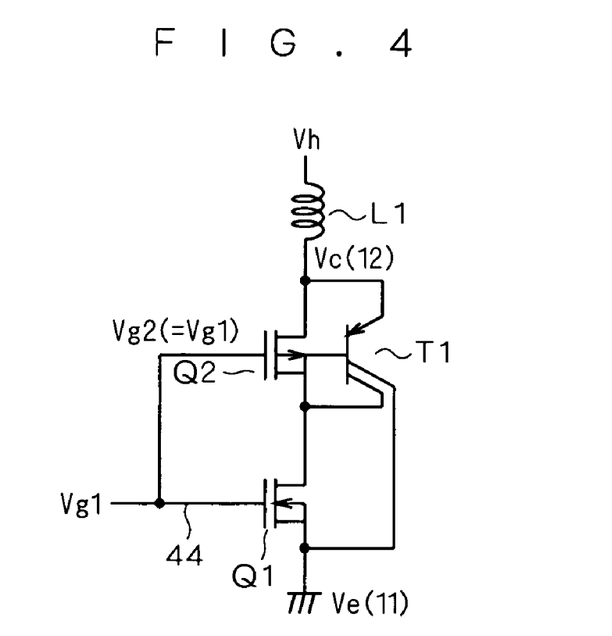
FIG. 4 is a circuit diagram showing a driving circuit for a semiconductor device according to a third preferred embodiment of this invention.

FIG. 4 is a circuit diagram showing a driving circuit for a semiconductor device according to the third preferred embodiment of this invention. As shown in FIG. 4, the coil L1 is added to the semiconductor device according to the first preferred embodiment, as in the second preferred embodiment.

As shown in FIG. 4, the first gate voltage Vg1 is applied to the gate of the NMOS transistor Q1 and also to the gate of the PMOS transistor Q2 as the second gate voltage Vg2 via a signal line 44 which is control signal supply means. The coil L1 has one end applied with the constant voltage Vh and the other end connected to the emitter of the PNP bipolar transistor T1 and the source of the PMOS transistor Q2.

In FIG. 4, the first gate voltage Vg1 is applied to the first gate terminal P1 and also to the second gate terminal P2, the emitter voltage Ve is applied to the emitter terminal P3, and the collector voltage Vc is applied to the collector terminal P4.

In such structure, during the IGBT's OFF state (when the first gate voltage Vg1 is 0V), the collector voltage Vc becomes the same potential as the constant voltage Vh (>Vth (threshold voltage of the PMOS transistor Q2)), thereby turning the PMOS transistor Q2 on reliably.

During turn-ON of the IGBT (when the first gate voltage Vg1 changes from 0V to the positive prescribed voltage (15V, for example)), a current flows to the PMOS transistor Q2 in the ON state, whereby most of the constant voltage Vh is consumed by the Ldi/dt component of the coil L1, and the collector voltage Vc quickly drops close to the ground potential. Then, the PMOS transistor Q2 enters the OFF state at the same time the collector voltage Vc falls below the threshold voltage Vth+15V, and the IGBT starts the operation.

During turn-OFF of the IGBT (when the first gate voltage Vg1 changes from 15V to 0V), on the other hand, the ON state is maintained until after residual carriers in most of the N⁻ epitaxial layer 2 are discharged. Then, the number of the residual carriers decreases and the collector voltage Vc rises again to become higher than the threshold voltage Vth before the PMOS transistor Q2 enters the ON state and interrupts hole supply. Subsequently, because holes are no longer supplied when the residual carriers become almost non-existent and the collector voltage Vc rises quickly, the IGBT shifts to the OFF state extremely quickly.

In this fashion, the driving circuit according to the third preferred embodiment that is provided with the coil L1 on the emitter side of the PNP bipolar transistor T1 and supplies the first gate voltage Vg1 as the second gate voltage Vg2 can also drive the semiconductor device according to the first preferred embodiment while maintaining low effective ON resistance and low switching loss, as in the first and second preferred embodiments.

Besides, the PMOS transistor Q2 is turned off with the collector voltage Vc=15V+Vth or lower during turn-ON of the IGBT, and is turned on with the collector voltage Vc=Vth or higher during turn-OFF of the IGBT. Because the PMOS transistor Q2 stops the IGBT operation while being in the ON state, it is desirable to turn the PMOS transistor Q2 off at the highest possible collector voltage Vc. On the other hand, because the PMOS transistor Q2 starts the IGBT operation while being in the OFF state, it is desirable to turn the PMOS transistor Q2 on at the lowest possible collector voltage Vc.

Accordingly, the third preferred embodiment satisfies the above requirement by using the first gate voltage Vg1 as the second gate voltage Vg2, and produces the effect of improving a tradeoff of the potential difference (15V) between ON/OFF of the first gate voltage Vg1.

Moreover, turn-OFF loss is effectively reduced by setting the threshold voltage Vth close to 0V so that the PMOS transistor Q2 enters the ON state promptly when the second gate voltage Vg2 (first gate voltage Vg1) is set at 0V.

The third preferred embodiment uses the first gate voltage Vg1 as the second gate voltage Vg2 without any problems. Alternatively, the similar effects can be obtained by adjusting the threshold voltage Vth of the PMOS transistor Q2 or a second gate voltage Vg2 independent of the first gate voltage Vg1.

The above tradeoff is further improved by performing positive and negative bias drive to control the second gate voltage Vg2 by applying a positive prescribed voltage during turn-ON and applying a negative prescribed voltage during turn-OFF, for example.

<Fourth Preferred Embodiment>

Figure 5:
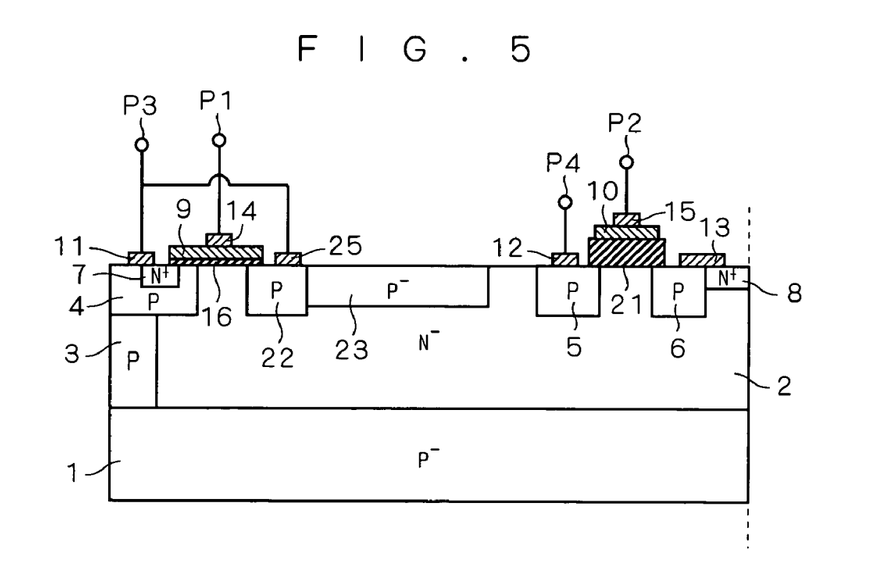
FIG. 5 is a cross-sectional view showing a semiconductor device structure having an IGBT according to a fourth preferred embodiment of this invention.

FIG. 5 is a cross-sectional view showing a semiconductor device structure having an IGBT according to a fourth preferred embodiment of this invention. As shown in FIG. 5, a P diffusion region 22 and a P⁻ diffusion region 23 which are both auxiliary diffusion regions are further formed between the P diffusion regions 4 and 5 in the upper part of the N⁻ epitaxial layer 2.

The P⁻ diffusion region 23 is formed opposite to the P diffusion region 4 with the N- epitaxial layer 2 below the conductive film 9 therebetween. The P diffusion region 22 is formed between the P⁻ diffusion region 23 and the P diffusion region 4 in the upper part of the N⁻ epitaxial layer 2, adjacently to the P⁻ diffusion region 23 and independently of the P diffusion region 4.

A conductive film 25 is formed on the P diffusion region 22, and the emitter terminal P3 is electrically connected to the conductive film 25. Thus the emitter electrode 11 and the conductive film 9 are short-circuited. The other constituent elements are similar to those in the semiconductor device shown in FIG. 1.

The semiconductor device having such structure according to the fourth preferred embodiment exhibits a double RESURF structure which attains high breakdown voltage because the P⁻ diffusion region 23 is depleted at the same time the N⁻ epitaxial layer 2 is depleted during the IGBT's OFF state. Therefore, ON resistance is reduced than a conventional RESURF structure and switching loss is effectively reduced because a hole current can be discharged via the P⁻ diffusion region 23 during turn-OFF.

The P diffusion region 22 is provided as an electrode (conductive film 25) connecting region for depleting the P⁻ diffusion region 23. The P diffusion region 22 is set to have a higher concentration than the P⁻ diffusion region 23 so that contact resistance is reduced while preventing a punch-through current from flowing to the electrode.

<Fifth Preferred Embodiment>

Figure 6:
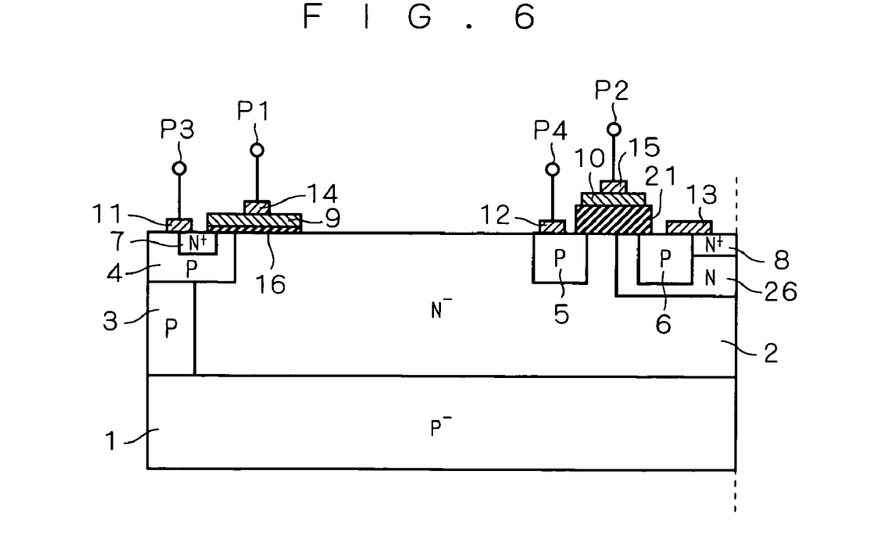
FIG. 6 is a cross-sectional view showing a semiconductor device structure having an IGBT according to a fifth preferred embodiment of this invention.

FIG. 6 is a cross-sectional view showing a semiconductor device structure having an IGBT according to a fifth preferred embodiment of this invention. As shown in FIG. 6, an N diffusion region 26 which is an auxiliary diffusion region is formed to cover the P diffusion region 6 and the N⁺ diffusion region 8 altogether in the upper part of the N⁻ epitaxial layer 2. The other constituent elements are similar to those in the semiconductor device shown in FIG. 1.

Also in the fifth preferred embodiment, the PNP bipolar transistor T1 forming the IGBT exhibits a multi-collector structure as shown in the equivalent circuit in FIG. 2, where the collector current flowing on the PMOS transistor Q2 side does not contribute to the IGBT operation, hindering the efficiency of the IGBT operation.

The N diffusion region 26 serves as a potential barrier against holes injected from the P diffusion region 5, thereby suppressing an influx of holes into the P diffusion region 6. Namely, the N diffusion region 26 allows a reduction in current amplification hFE on the second collector side of the PNP bipolar transistor T1 which is continuous with the PMOS transistor Q2, and produces the effect of executing the IGBT operation more effectively.

<Sixth Preferred Embodiment>

Figure 7:
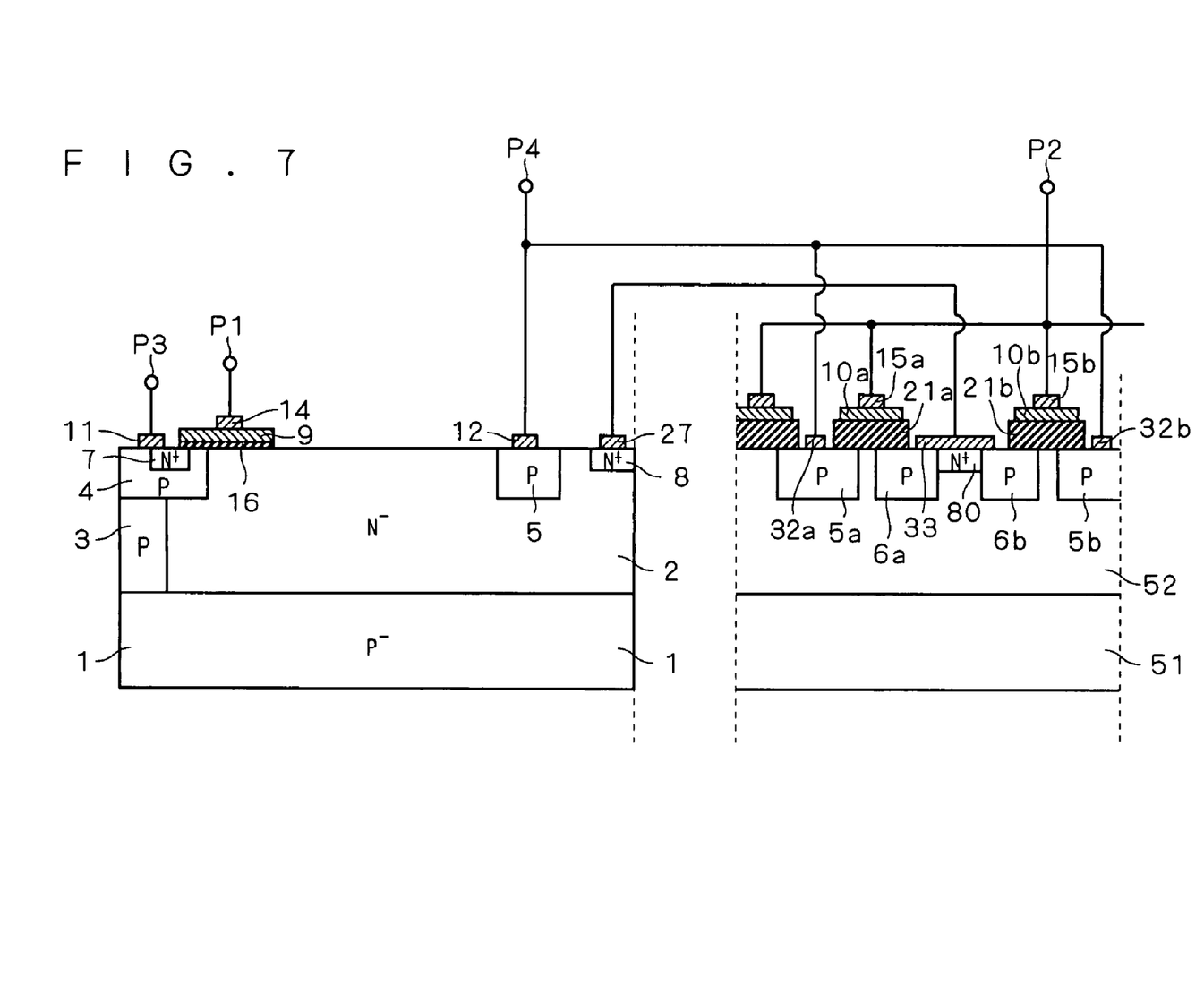
FIG. 7 is a cross-sectional view showing a semiconductor device structure having an IGBT according to a sixth preferred embodiment of this invention.

FIG. 7 is a cross-sectional view showing a semiconductor device structure having an IGBT according to a sixth preferred embodiment of this invention. As shown in FIG. 7, an additional P⁻ substrate 51 is provided independently of the P⁻ substrate 1, and a PMOS transistor structure corresponding to the PMOS transistor Q2 is provided on the P⁻ substrate 51 to thereby remove the PMOS transistor structure on a surface of the P⁻ substrate 1.

On the P⁻ substrate 1 side, the P diffusion region 5 is selectively formed independently of the P diffusion region 4, and the N⁺ diffusion region 8 is formed independently of the P diffusion region 5 in the upper part of the N⁻ epitaxial layer 2 (first base layer). The collector electrode 12 is provided on the P diffusion region 5 and a conductive film 27 is formed on the N⁺ diffusion region 8. The NMOS transistor Q1 structure (first gate electrode 14, P diffusion region 4 and the like) is the same as the first preferred embodiment shown in FIG. 1.

On the P⁻ substrate 51 side, an N⁻ epitaxial layer 52 (second base layer) is formed on the P⁻ substrate 51, and P diffusion regions 5a, 6a, 6b and 5b which are all electrode diffusion regions are selectively formed, respectively, in the upper part of the N⁻ epitaxial layer 52. A conductive film 10a is formed via a gate oxide film 21a on the N⁻ epitaxial layer 52 between the P diffusion regions 5a and 6a, and a second gate electrode 15a is provided on the conductive film 10a. A conductive film 10b is formed via a gate oxide film 21b on the N⁻ epitaxial layer 52 between the P diffusion regions 5b and 6b, and a second gate electrode 15b is provided on the conductive film 10b.

An N⁺ diffusion region 80 is formed between the P diffusion regions 6a and 6b in the upper part of the N⁻ epitaxial layer 52, adjacently to both of the P diffusion regions 6a and 6b. A conductive film 33 is formed across part of a surface of the P diffusion region 6a, the N⁺ diffusion region 80 and part of a surface of the P diffusion region 6b.

A conductive film 32a is formed on the P diffusion region 5a, while a conductive film 32b is formed on the P diffusion region 5b. The second gate terminal P2 is electrically connected to both of the second gate electrodes 15a and 15b, while the collector terminal P4 is electrically connected to the collector electrode 12 on the P⁻ substrate 1 side and the conductive films 32a, 32b on the P⁻ substrate 51 side. Further, the conductive film 27 on the P⁻ substrate 1 side and the conductive film 33 on the P⁻ substrate 51 side are short-circuited.

Namely, the P⁻ substrate 51 side realizes a single PMOS transistor by connecting a plurality of PMOS transistor structures (a PMOS transistor including the P diffusion regions 5a, 6a and the second gate electrode 15a, and a PMOS transistor including the P diffusion regions 5b, 6b and the second gate electrode 15b) in parallel.

Figure 8:
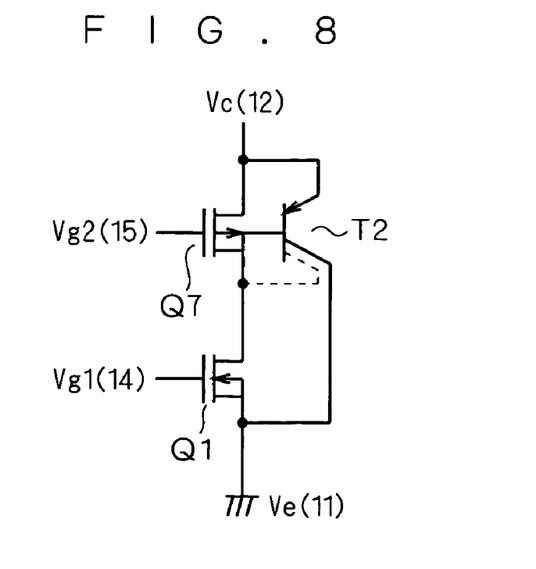
FIG. 8 is a circuit diagram showing an equivalent circuit of the semiconductor device according to the sixth preferred embodiment shown in FIG. 7.

FIG. 8 is a circuit diagram showing an equivalent circuit of the semiconductor device according to the sixth preferred embodiment shown in FIG. 7. As shown in FIG. 8, the semiconductor device according to the sixth preferred embodiment includes a PNP bipolar transistor T2, the NMOS transistor Q1, and a PMOS transistor Q7.

The PNP bipolar transistor T2 exhibits a single emitter structure because of the independent formation of the PNP bipolar transistor T2 on the P⁻ substrate 1 and the PMOS transistor Q7 on the P⁻ substrate 51. The "PMOS transistor Q7" refers to the single PMOS transistor including the plurality of PMOS transistors connected in parallel as shown in FIG. 7.

As shown in FIG. 8, the PMOS transistor Q7 and the NMOS transistor Q1 are inserted in series between the emitter and collector of the PNP bipolar transistor T2. The source of the PMOS transistor Q7 is connected to the emitter of the PNP bipolar transistor T2, and the source of the NMOS transistor Q1 is connected to the collector of the PNP bipolar transistor T2.

In this fashion, the semiconductor device according to the sixth preferred embodiment forms the PNP bipolar transistor T2 and the PMOS transistor Q7 on the N⁻ epitaxial layer 2 and the N⁻ epitaxial layer 52, respectively, which are independently provided base layers. Therefore, all holes from the P diffusion region 5 contribute to the IGBT operation, thereby eliminating losses due to holes flowing to the PMOS transistor Q7. This means eliminating the component flowing through a dotted line in the equivalent circuit of FIG. 8.

<Seventh Preferred Embodiment>

Figure 9:
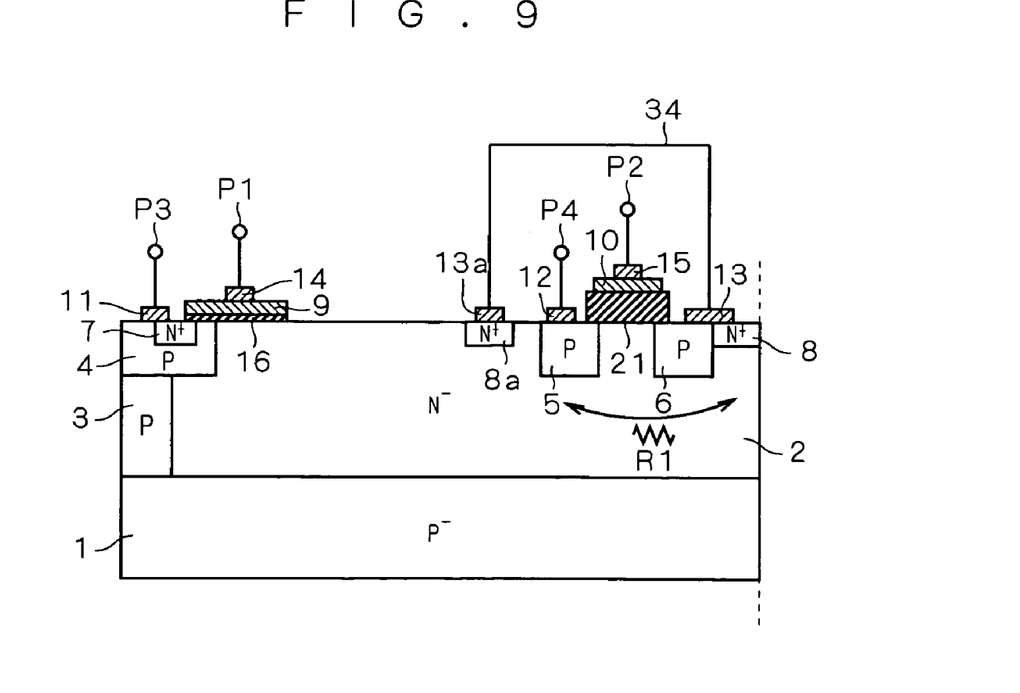
FIG. 9 is a cross-sectional view showing a semiconductor device structure having an IGBT according to a seventh preferred embodiment of this invention.

FIG. 9 is a cross-sectional view showing a semiconductor device structure having an IGBT according to a seventh preferred embodiment of this invention. As shown in FIG. 9, an N⁺ diffusion region 8a which is a second auxiliary diffusion region is formed close to the P diffusion region 5 between the P diffusion regions 4 and 5 in the upper part of the N⁻ epitaxial layer 2, and a floating electrode 13a is provided on the N⁺ diffusion region 8a. The floating electrode 13a and the floating electrode 13 formed on the N⁺ diffusion region 8 which is a first auxiliary diffusion region are short-circuited by an aluminum wiring 34. The other constituent elements are similar to those in the semiconductor device shown in FIG. 1

Figure 10:
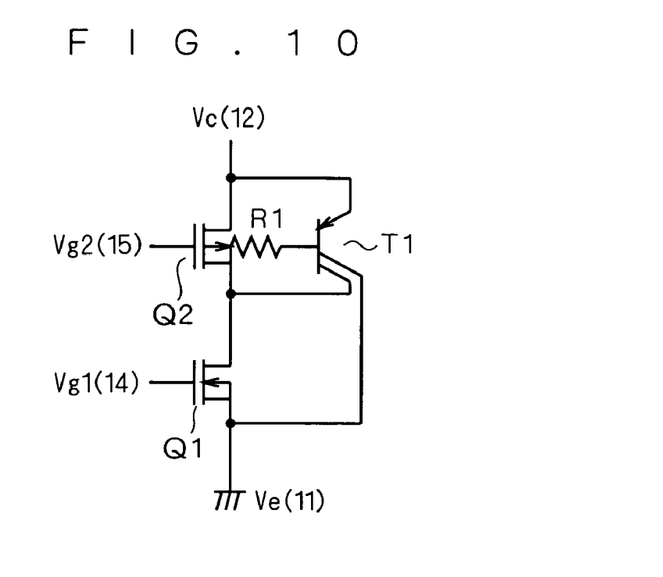
FIG. 10 is a circuit diagram showing an equivalent circuit of the semiconductor substrate according to the first preferred embodiment in view of parasitic resistance.

FIG. 10 is a circuit diagram showing the equivalent circuit of the semiconductor substrate according to the first preferred embodiment in view of parasitic resistance. As shown in FIG. 10, there exists parasitic resistance R1 (schematically shown also in FIG. 9) from immediately below the P diffusion region 5 to the N⁺ diffusion region 8 in the semiconductor device according to the first preferred embodiment. Because of this, the ON resistance of the PMOS transistor Q2 is deteriorated and a short-circuit function of the PMOS transistor Q2 in the ON state is weakened. It is thus desired to reduce the parasitic resistance R1.

The semiconductor device according to the seventh preferred embodiment provides the N⁺ diffusion region 8a to establish a direct current path (aluminum wiring 34) from the N⁺ diffusion region 8a to the N⁺ diffusion region 8. Therefore, the semiconductor device produces the effect of substantially eliminating the parasitic resistance R1.

Moreover, the N⁺ diffusion region 8a also has a depletion layer suppressing function of preventing the depletion layer from reaching the P diffusion region 5 in the breakdown voltage maintaining state. Therefore, the semiconductor device attains the effect of suppressing the depletion layer and the effect of eliminating the parasitic resistance simultaneously only by providing the N⁺ diffusion region 8a. Namely, the above two effects can be attained effectively in terms of area thanks to the N⁺ diffusion region 8a.

<Eighth Preferred Embodiment>

Figure 11:
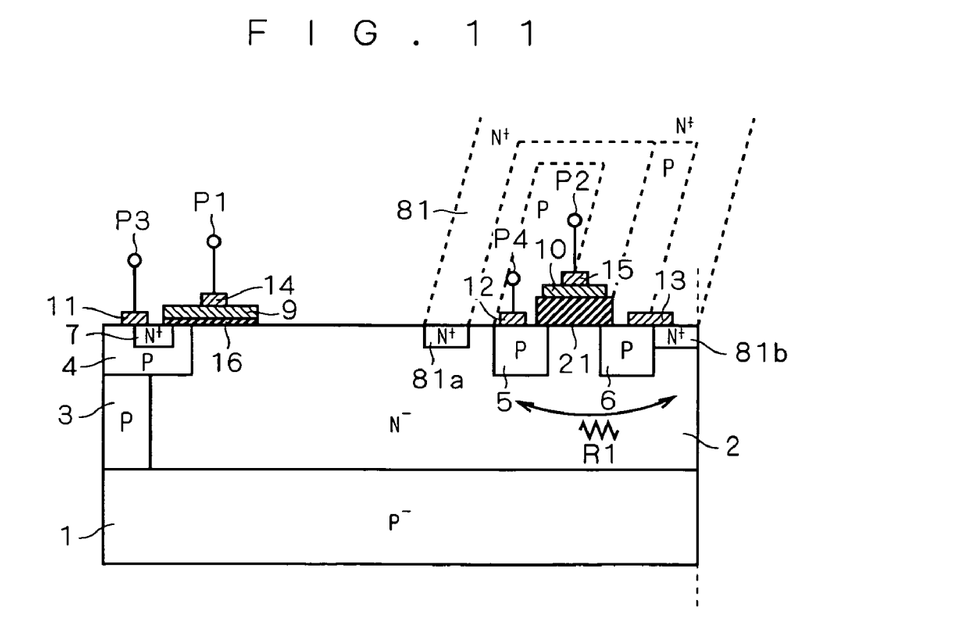
FIG. 11 is a cross-sectional view showing a semiconductor device structure having an IGBT according to an eighth preferred embodiment of this invention.

FIG. 11 is a cross-sectional view showing a semiconductor device structure having an IGBT according to an eighth preferred embodiment of this invention. As shown in FIG. 11, an N⁺ diffusion region 81 (common auxiliary diffusion region) is integrally formed in the upper part of the N⁻ epitaxial layer 2, which, in plan view, extends from an N⁺ diffusion region part 81a (corresponding to the N⁺ diffusion region 8a in FIG. 9) close to the P diffusion region 5 between the P diffusion regions 4 and 5 to an N⁺ diffusion region part 81b (corresponding to the N⁺ diffusion region 8 in FIG. 9) formed adjacently to the P diffusion region 6 while bypassing the P diffusion regions 5 and 6. The other constituent elements are similar to those in the seventh preferred embodiment structure shown in FIG. 9.

In this fashion, the semiconductor device according to the eighth preferred embodiment also produces the effect of substantially eliminating the parasitic resistance R1 by providing the N⁺ diffusion region 81, as in the seventh preferred embodiment.

Besides, the structure can be further simplified by forming an N⁺ diffusion region 81 which integrates the N⁺ diffusion region parts 81a and 81b to eliminate the aluminum wiring 34 that is required in the seventh preferred embodiment.

<Others>

Needless to say, the same effects can also be attained by applying the inverter driving circuit 18 in the first preferred embodiment and the driving circuits in the second and third preferred embodiments to the semiconductor devices in the fourth to eighth preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an insulated gate bipolar transistor (IGBT) of a first conductivity type including a first insulated gate transistor of said first conductivity type and a bipolar transistor of a second conductivity type connected between first and second main electrodes; and
   a second insulated gate transistor of said second conductivity type configured to short-circuit a base and emitter of said bipolar transistor during an ON state of said second insulated gate transistor, wherein
   a thickness of a gate insulating film of said second insulated gate transistor is so set as to satisfy a prescribed breakdown voltage higher than an element breakdown voltage of said IGBT.

2. The semiconductor device according to claim 1, wherein
   said bipolar transistor includes a base layer of said first conductivity type, and first and second electrode diffusion regions of said second conductivity type formed selectively in an upper part of said base layer, and
   an auxiliary diffusion region of said second conductivity type is provided between said first and second electrode diffusion regions in the upper part of said base layer.

3. The semiconductor device according to claim 1, wherein
   said bipolar transistor includes a base layer of said first conductivity type, and first and second electrode diffusion regions of said second conductivity type formed selectively in an upper part of said base layer, said second insulated gate transistor includes said base layer, said second electrode diffusion region, a third electrode diffusion region of said second conductivity type formed selectively in the upper part of said base layer, and a gate electrode formed via said gate insulating film on said base layer between said second and third electrode diffusion regions, and
   an auxiliary diffusion region of said first conductivity type having a higher impurity concentration of said first conductivity type than said base layer is provided to cover said third electrode diffusion region in the upper part of said base layer.

4. The semiconductor device according to claim 1, wherein
   said bipolar transistor includes a first base layer of said first conductivity type, and first and second electrode diffusion regions of said second conductivity type formed selectively in an upper part of said first base layer, said second insulated gate transistor includes a second base layer of said first conductivity type, third and fourth electrode diffusion regions of said second conductivity type formed selectively in the upper part of said second base layer, and a gate electrode formed via said gate insulating film on said second base layer between said third and fourth electrode diffusion regions, and said first and second base layers are provided independently of each other.

5. The semiconductor device according to claim 1, wherein said bipolar transistor includes a base layer of said first conductivity type, and first and second electrode diffusion regions of said second conductivity type formed selectively in an upper part of said base layer, said first insulated gate transistor includes said base layer, a third electrode diffusion region of said first conductivity type formed selectively in the upper part of said first electrode diffusion region, and a first gate electrode formed via another gate insulating film different from said gate insulating film on said first electrode diffusion region between said base layer and said third electrode diffusion region, and said second insulated gate transistor includes said base layer, said second electrode diffusion region, a fourth electrode diffusion region of said second conductivity type formed selectively in the upper part of said base layer, and a second gate electrode formed via said gate insulating film on said base layer between said second and fourth electrode diffusion regions, said semiconductor device further comprising:

a first auxiliary diffusion region of said first conductivity type having a higher impurity concentration of said first conductivity type than said base layer, formed adjacently to said fourth electrode diffusion region in the upper part of said base layer; and a second auxiliary diffusion region of said first conductivity type having a higher impurity concentration of said first conductivity type than said base layer between said first and second electrode diffusion regions in the upper part of said base layer, wherein said first and second auxiliary diffusion regions have an electrical connection relationship to each other.

6. The semiconductor device according to claim 5, further comprising:

a metal wiring electrically connecting said first and second auxiliary diffusion regions.

7. The semiconductor device according to claim 5, wherein said first and second auxiliary diffusion regions include an integrally formed common auxiliary diffusion region in an upper part of said base layer which extends from a region between said first and second electrode diffusion regions to a region adjacent to said fourth electrode diffusion region in plan view.

8. A driving circuit for a semiconductor device, wherein said semiconductor device comprises:

an insulated gate bipolar transistor (IGBT) of a first conductivity type including a first insulated gate transistor of said first conductivity type and a bipolar transistor of a second conductivity type connected between first and second main electrodes; and a second insulated gate transistor of said second conductivity type configured to short-circuit a base and emitter of said bipolar transistor during an ON state of said second insulated gate transistor, wherein a thickness of a gate insulating film of said second insulated gate transistor is so set as to satisfy a prescribed breakdown voltage higher than an element breakdown voltage of said IGBT, and said driving circuit comprises:

first control signal supply means supplying a first control signal to a gate electrode of said first insulated gate transistor; and second control signal supply means supplying a second control signal obtained in response to said first control signal to the gate electrode of said second insulated gate transistor, wherein said second control signal supply means generates, as said second control signal, a first voltage for turning said second insulated gate transistor off when said first control signal provides instructions to turn said first insulated gate transistor on, and generates a second voltage for turning said second insulated gate transistor on when said first control signal provides instructions to turn said first insulated gate transistor off.

9. A driving circuit for a semiconductor device, wherein said semiconductor device comprises:

an insulated gate bipolar transistor (IGBT) of a first conductivity type including a first insulated gate transistor of said first conductivity type and a bipolar transistor of a second conductivity type connected between first and second main electrodes; and a second insulated gate transistor of said second conductivity type configured to short-circuit a base and emitter of said bipolar transistor during a ON state of said second insulated gate transistor, wherein a thickness of a gate insulating film of said second insulated gate transistor is so set as to satisfy a prescribed breakdown voltage higher than an element breakdown voltage of said IGBT, and said driving circuit comprises:

a coil having one end applied with a constant voltage and the other end connected to the emitter electrode of said bipolar transistor;

control signal supply means supplying a first control signal to a gate electrode of said first insulated gate transistor; and fixed voltage supply means supplying a fixed potential obtained by shifting said constant voltage in the direction of turning said second insulated gate transistor on, to the gate electrode of said second insulated gate transistor.

10. A driving circuit for a semiconductor device, wherein said semiconductor device comprises:

an insulated gate bipolar transistor (IGBT) of a first conductivity type including a first insulated gate transistor of said first conductivity type and a bipolar transistor of a second conductivity type connected between first and second main electrodes; and a second insulated gate transistor of said second conductivity type configured to short-circuit a base and emitter of said bipolar transistor during a ON state of said second insulated gate transistor, wherein a thickness of a gate insulating film of said second insulated gate transistor is so set as to satisfy a prescribed breakdown voltage higher than an element breakdown voltage of said IGBT, and said driving circuit comprises:

a coil having one end applied with a constant voltage and the other end connected to the emitter electrode of said bipolar transistor; and a control signal supply means supplying the same control signal to a gate electrodes of both said first and second insulated gate transistors.

* * * * *